(12) United States Patent
Zeng et al.

(10) Patent No.: US 10,347,546 B2
(45) Date of Patent: Jul. 9, 2019

(54) INTEGRATED CIRCUIT STRUCTURE INCLUDING POWER RAIL AND TAPPING WIRE WITH METHOD OF FORMING SAME

(71) Applicant: GLOBALFOUNDRIES Inc., Grand Cayman (KY)

(72) Inventors: Jia Zeng, Sunnyvale, CA (US); Wenhui Wang, San Jose, CA (US); Xuelian Zhu, San Jose, CA (US); Jongwook Kye, Pleasanton, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/389,632

(22) Filed: Dec. 23, 2016

(65) Prior Publication Data
US 2018/0182675 A1   Jun. 28, 2018

(51) Int. Cl.
*H01L 23/528* (2006.01)
*H01L 23/532* (2006.01)
(Continued)

(52) U.S. Cl.
CPC .......... *H01L 21/845* (2013.01); *H01L 23/485* (2013.01); *H01L 23/5283* (2013.01);
(Continued)

(58) Field of Classification Search
CPC ............ H01L 23/5226; H01L 23/5286; H01L 23/535; H01L 23/538; H01L 23/5386; H01L 23/53257; H01L 23/585; H01L 27/092; H01L 27/1211; H01L 21/845; H01L 21/823431; H01L 21/823475; H01L 24/30; H01L 24/33; H01L 24/82; H01L 23/528; H01L 23/522; H01L 23/53228; H01L 2224/18; H01L 2224/34; H01L 2224/80; H01L 2224/82; H01L 2224/83; H01L 2224/80001; H01L 2924/13067; H01L 2924/13081; H01L 2924/13084; H01L 2924/14; H01L 2924/1434; H01L 29/0665; H01L 29/41791; H01L 29/41783; H01L 29/401; H01L 29/66795;
(Continued)

(56) References Cited

U.S. PATENT DOCUMENTS 7,137,092 B2 * 11/2006 Maeda ................ G06F 17/5068
716/53
8,680,626 B2 *  3/2014 Smayling .......... H01L 21/28518
257/211

(Continued)

*Primary Examiner* — Natalia A Gondarenko
(74) *Attorney, Agent, or Firm* — Francois Pagette; Hoffman Warnick LLC

(57) ABSTRACT

The disclosure relates to integrated circuit (IC) structures with substantially T-shaped wires, and methods of forming the same. An IC structure according to the present disclosure can include a first substantially T-shaped wire including a first portion extending in a first direction, and a second portion extending in a second direction substantially perpendicular to the first direction; an insulator laterally abutting the first substantially T-shaped wire at an end of the first portion, opposite the second portion; and a pair of gates each extending in the first direction and laterally abutting opposing sidewalls of the insulator and the first portion of the substantially T-shaped wire.

17 Claims, 18 Drawing Sheets

(51) Int. Cl.

| | | |
|---|---|---|
| *H01L 29/06* | (2006.01) | |
| *H01L 29/08* | (2006.01) | |
| *H01L 27/105* | (2006.01) | |
| *H01L 27/108* | (2006.01) | |
| *H01L 27/112* | (2006.01) | |
| *H01L 21/84* | (2006.01) | |
| *H01L 27/12* | (2006.01) | |
| *H01L 23/485* | (2006.01) | |
| *H01L 21/82* | (2006.01) | |
| *H01L 21/8234* | (2006.01) | |
| *H01L 27/088* | (2006.01) | |

(52) U.S. Cl.
CPC ...... *H01L 23/5286* (2013.01); *H01L 27/1211* (2013.01); *H01L 21/823431* (2013.01); *H01L 21/823468* (2013.01); *H01L 21/823475* (2013.01); *H01L 27/0886* (2013.01)

(58) Field of Classification Search
CPC ............. H01L 29/785; H01L 21/02164; H01L 21/0217; H01L 21/31105; H01L 21/28247; H01L 21/76802; H01L 21/76877; H01L 2027/11881; H01L 2027/11883; H01L 2027/11875; G06F 17/5077; G06F 2217/06
USPC ....... 257/401, 750, 758, 207, 202, 203, 206; 438/629, 631, 672, 675
See application file for complete search history.

(56) References Cited

U.S. PATENT DOCUMENTS

| | | | |
|---|---|---|---|
| 9,437,481 B2 | 9/2016 | Yuan et al. | |
| 9,502,351 B1 | 11/2016 | Sahu | |
| 9,570,395 B1 * | 2/2017 | Sengupta | ............ H01L 23/5286 |
| 9,627,321 B2 * | 4/2017 | Boyanov | ............ H01L 23/53238 |
| 2015/0052494 A1 | 2/2015 | Tarabbia et al. | |
| 2016/0181235 A1 * | 6/2016 | Pincu | ................. H01L 27/0207 257/207 |
| 2017/0154966 A1 * | 6/2017 | Huang | ............. H01L 21/02164 |
| 2017/0244394 A1 * | 8/2017 | Kim | ................. H03K 3/356156 |

* cited by examiner

U.S. 10,347,546 B2

INTEGRATED CIRCUIT STRUCTURE INCLUDING POWER RAIL AND TAPPING WIRE WITH METHOD OF FORMING SAME

BACKGROUND

Technical Field

The present application relates to integrated circuit (IC) structures and methods of forming the same. More particularly, the present application relates to IC structures which include a power rail and tapping wire integrated into a single conductive region.

Related Art

Design systems are commonly used to design integrated circuits (ICs) and, in particular, to design back end of line (BEOL) interconnect structures. As advances occur, smaller widths for wires and vias are provided. For example, seven nanometer node design rules may allow only uni-directional wiring at any metal layer, which precludes the use of two-dimensional designs in a metal layer. BEOL design must comply with these design rules before manufacture. Design rule spacing constraints for BEOL interconnect structures can limit a variety of attributes, e.g., the maximum separation distance between adjacent gates in a cell array in a BEOL structure. Such constraints can affect the ability to form functional elements which connect gates and/or other structures together, e.g., power rails for electrically driving the operation of the cell array. Existing fabrication techniques may change the position of cells and power rails relative to each other to comply with these design rules and other constraints, but may have limited practical utility as a result of processing modifications.

SUMMARY

A first aspect of the disclosure provides an integrated circuit (IC) structure, including: a first conductive region including a tapping wire extending in a first direction, and a power rail extending in a second direction substantially perpendicular to the first direction; an insulator laterally abutting the first conductive region at an end of the tapping wire, opposite the power rail; and a pair of gates each extending in the first direction and laterally abutting opposing sidewalls of the insulator and the tapping wire of the first conductive region.

A second aspect of the disclosure provides a method of forming an integrated circuit (IC) structure, the method including: providing a structure including: a pair of gates positioned on a buried insulator layer, and a semiconductor material positioned on the buried insulator layer and the pair of gates; removing a first portion of the semiconductor material to expose a lateral sidewall of each of the pair of gates and form an opening between the pair of gates; filling the opening with an insulator; removing a second portion of the semiconductor material to form a rail trench laterally adjacent to the pair of gates, such that a remaining portion of the semiconductor material is positioned between the rail trench and the insulator; forming a pair of spacers on interior sidewalls of the rail trench; removing the remaining portion of the semiconductor material positioned between the rail trench and the insulator to form a wire trench, wherein a portion of one of the pair of spacers is positioned between the wire trench and the rail trench; removing the portion of one of the pair of spacers to connect the rail trench to the wire trench; and filling the rail trench and the wire trench with a conductor.

A third aspect of the disclosure provides a method of forming an integrated circuit (IC) structure, including: providing a structure including: a first semiconductor region extending in a first direction, a first gate extending in the first direction and laterally abutting a first lateral sidewall of the semiconductor material, a second gate extending in the first direction and laterally abutting a second lateral sidewall of the semiconductor material, and a second semiconductor region extending in a second direction substantially perpendicular to the first direction, wherein the second semiconductor region laterally abuts the first gate, the second gate, and the first semiconductor region; removing a portion of the second semiconductor region to form a rail trench extending in the second direction, wherein the rail trench includes a pair of opposing interior sidewalls; forming a pair of spacers on the opposing sidewalls of the rail trench; removing a portion of the first semiconductor region to form a wire trench extending in the first direction, wherein a portion of one of the pair of spacers is positioned between the wire trench and the rail trench; removing the portion one of the pair of spacers to connect the wire trench to the rail trench; and filling the wire trench and the rail trench with a conductor.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be used and that changes may be made without departing from the scope of the present teachings. The following description is, therefore, merely exemplary.

Figure 1:
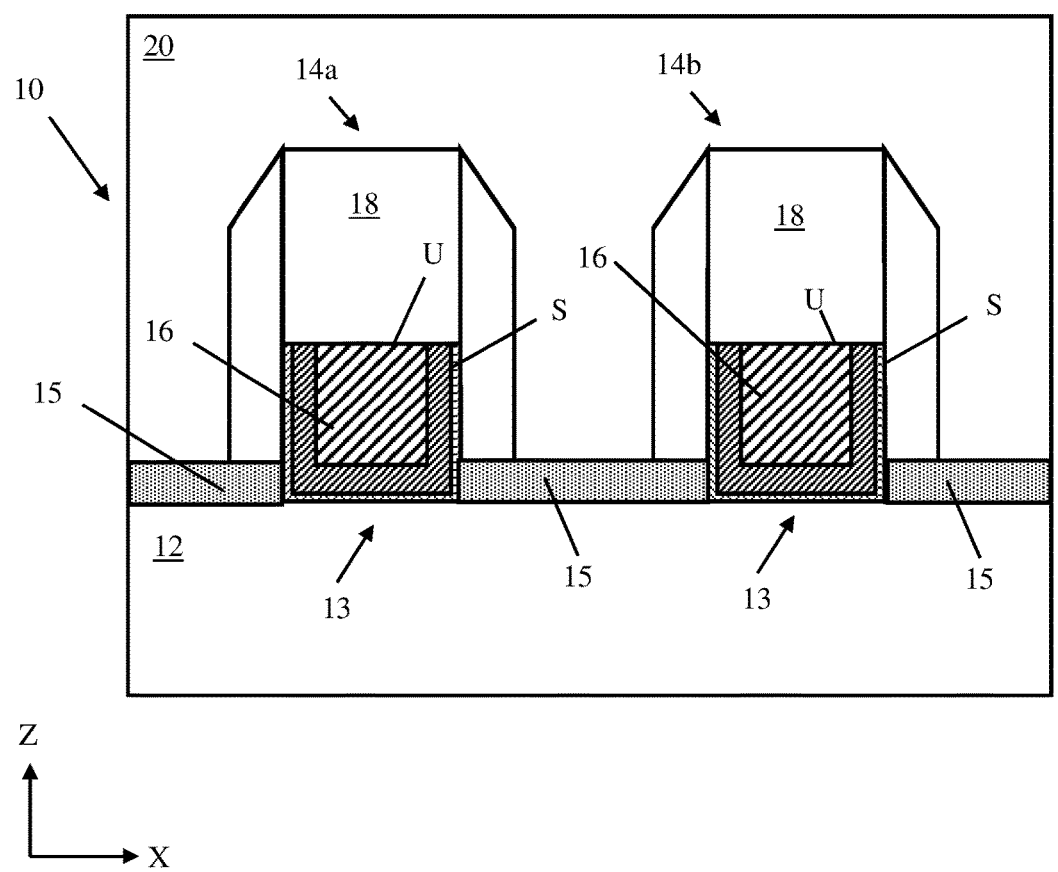
FIG. 1 shows a cross-sectional view of a structure to be processed according to embodiments of the disclosure.

Referring to FIG. 1, embodiments of the present disclosure include integrated circuit (IC) structures formed to include a single conductive region with a power rail and tapping wire included therein. The present disclosure also includes methods of forming the same. FIG. 1 depicts a structure 10 to be processed according to the present disclosure. Structure 10 can include, e.g., a buried insulator layer 12 on which a set of transistor structures 13, including respective gates 14a, 14b, are formed. Each gate 14a, 14b can extend in parallel to each other. Buried insulator layer 12 can be composed of any currently-known or later developed substance for providing electrical insulation, and as examples may include, e.g., silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof.

Gates 14a, 14b of transistor(s) 13 may not include all functional components used in a complete IC structure, and may include one or more dummy gates to be processed at a different stage of forming a product. Each gate 14a, 14b may cover a semiconductor fin 15 positioned on buried insulator layer 12, e.g., by coating exposed sidewalls and an upper surface of semiconductor fin 15. Semiconductor fin 15 can include, e.g., one or more currently-known or later developed semiconductive substances generally used in semiconductor manufacturing, including without limitation: silicon (e.g., crystal silicon), germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). In laterally distinct portions of structure 10, semiconductor fin 15 may not be positioned on buried insulator layer 12, e.g., such that gates 14a, 14b contact and overlie buried insulator layer 12 and/or different portions of structure 10. Portions of semiconductor fin 15 separated by gates 14a, 14b, can serve as source/drain terminals to a transistor structure as known in the art.

Each gate 14a, 14b of transistor(s) 13 can include a gate stack 16 contacting and overlying semiconductor fin 15 and/or buried insulator 12. Each gate stack 16 can include, e.g., a metal separated from underlying components (e.g., conductive or semiconductive materials) by a gate dielectric layer composed of one or more of the example insulating materials described herein. Each gate stack 16 can contact and overlie buried insulator layer 12, as shown, and/or contact and overlie a portion of semiconductor fin 15. Gates 14a, 14b can each include a gate spacer 18 contacting and overlying gate stack 16, e.g., on upper surfaces U and sidewalls S thereof, and optionally overlying portions of buried insulator layer 12. Gate spacer 18 can be provided as one or more bodies of insulating material formed on exposed portions of buried insulator layer 12 and/or gates 14a, 14b, e.g., by deposition, thermal growth, etc., and may include materials and/or other structures formed on or adjacent to gate stack(s) 16 electrically and physically insulate gate stack(s) 16 from other components of structure 10. In an example embodiment, gate spacer 18 can be provided as a region of silicon nitride (SiN) with or without other insulating materials being included therein. An inter-level dielectric (ILD) 20 can be positioned over and in contact with gate spacer 18 on structure 10. ILD 20 may include any currently-known or later developed insulating material including inorganic dielectric materials, organic dielectric materials, or combinations thereof, e.g., various materials described elsewhere herein relative to buried insulator layer 12.

Figure 2:
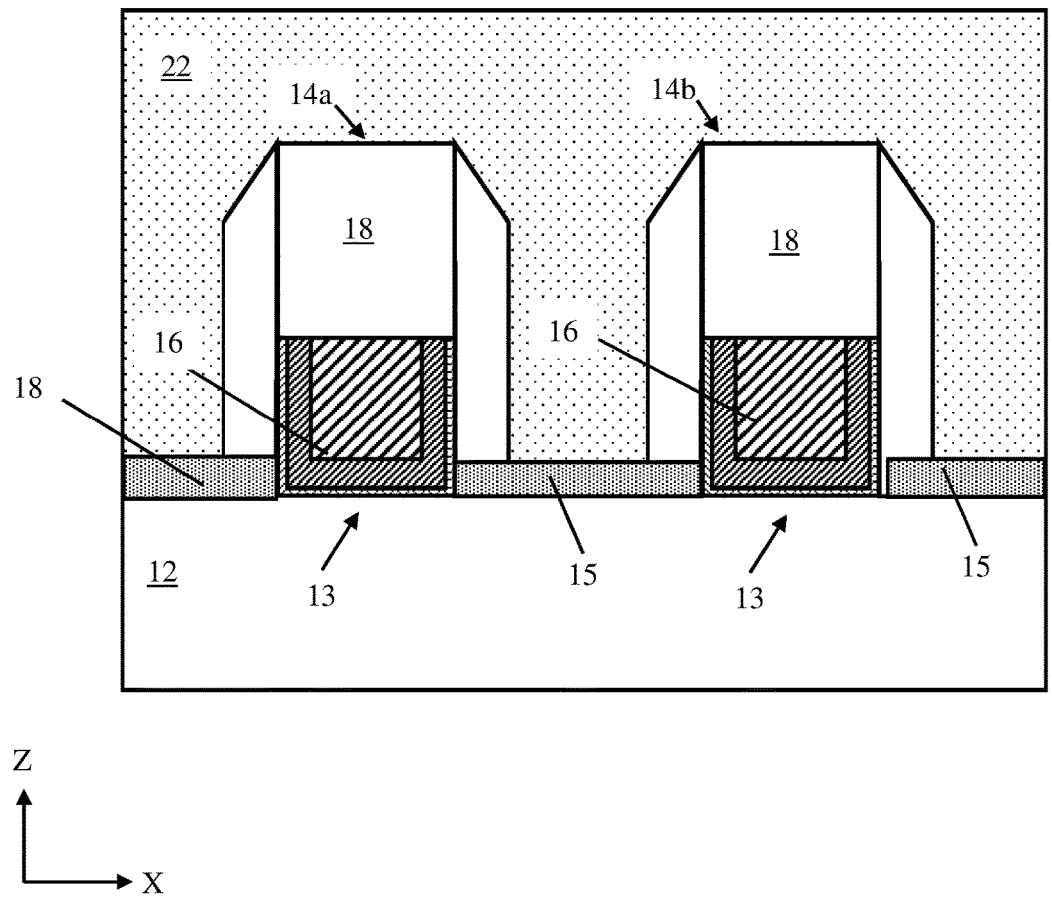
FIG. 2 shows a cross-sectional view of a structure being processed according to embodiments of the disclosure.

Turning to FIG. 2, embodiments of the present disclosure can include preparing structure 10 (FIG. 1) to be processed according to the disclosure. In particular, ILD 20 can be removed and thereafter replaced with a semiconductive material. ILD 20 can be removed from gate spacer 18, e.g., by etching (including wet etching and/or dry etching), and/or other processes for removing a material) any currently-known or later developed selective or non-selective removal technique to expose gate spacer 18. Thereafter, a semiconductor material 22 can be formed over buried insulator layer 12, gates 14a, 14b, and gate spacer 18 where applicable. Semiconductor material 22 can include, e.g., one or more of the example semiconductor materials included in semiconductor fin 15, and more specifically may include amorphous silicon. To facilitate selective removal of some portions of semiconductor material 22, the composition of semiconductor material 22 may be distinct from semiconductor fin 15.

Figure 3:
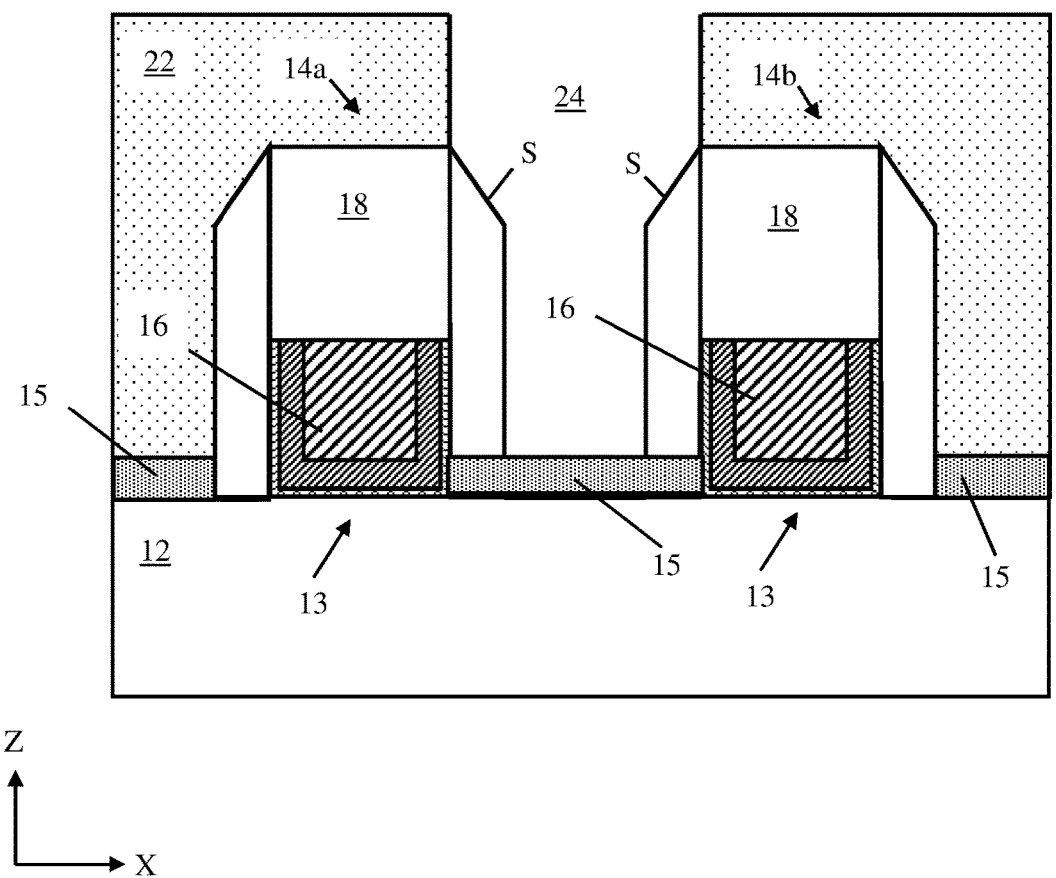
FIG. 3 shows a cross-sectional view of an opening being formed according to embodiments of the disclosure.
Figure 4:
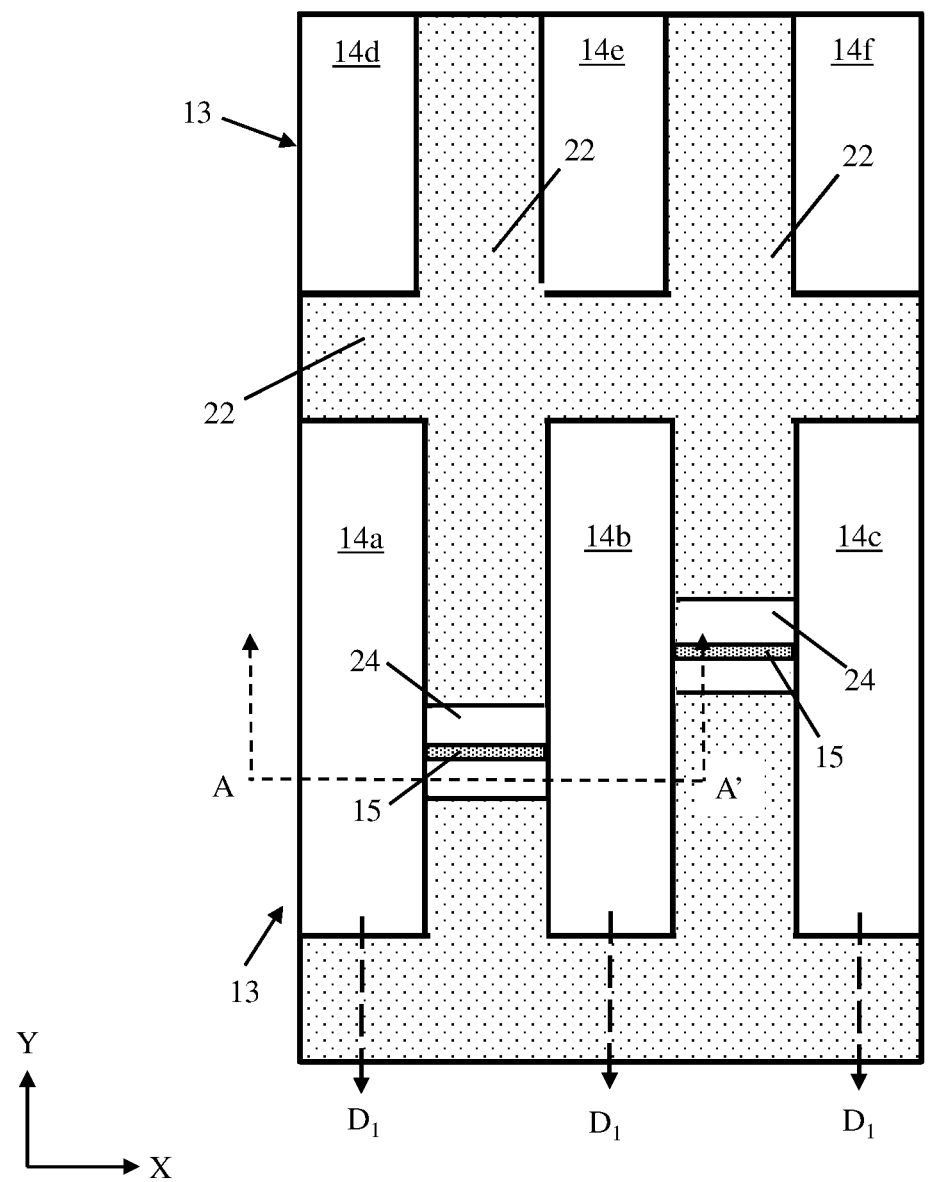
FIG. 4 shows a plan view of a structure with openings according to embodiments of the disclosure.

Referring to FIGS. 3 and 4 together, embodiments of the present disclosure can include removing a first portion of semiconductor material 22 to form an opening 24 therein. Removing the first portion of semiconductor material 22 can expose portions of gate spacer 18 which define lateral sidewalls S of each gate 14a, 14b of transistor(s) 13, and/or underlying portions of buried insulator layer 12 or semiconductor fin(s) 15. Multiple gates 14a, 14b, 14c, can be oriented in parallel with each other and thus define a first directional orientation $D_1$ (also referred to as a "first direction" herein) substantially in parallel with the Y-axis (FIG. 4). Semiconductor fin(s) 15 overlying buried insulator layer 12 may also line a lower surface of opening 24, e.g., as a result of forming opening 24 with a selective etchant which removes semiconductor material 22 but leaves semiconductor fin 15 intact. FIG. 3 depicts a cross-sectional view from the position of line A-A' in the X-Z plane, while FIG. 4 depicts a plan view in the X-Y plane. In FIG. 4, three gates 14a, 14b, 14c oriented in parallel with each other are shown to be substantially laterally aligned with three other gates 14d, 14e, 14f. Openings 24 can be positioned directly laterally between two gates, e.g., between gates 14a, 14b and/or between gates 14b, 14c. Opening 24 can be formed between gates 14a, 14b, 14c at predetermined locations, e.g., by placing a mask (not shown) on gates 14a, 14b, 14c and semiconductor material 22 without covering predetermined portions of semiconductor material 22 to be removed as discussed herein. Some portions of semiconductor material 22 may not be removed, e.g., by being covered by a masking material when openings 24 are formed.

Figure 5:
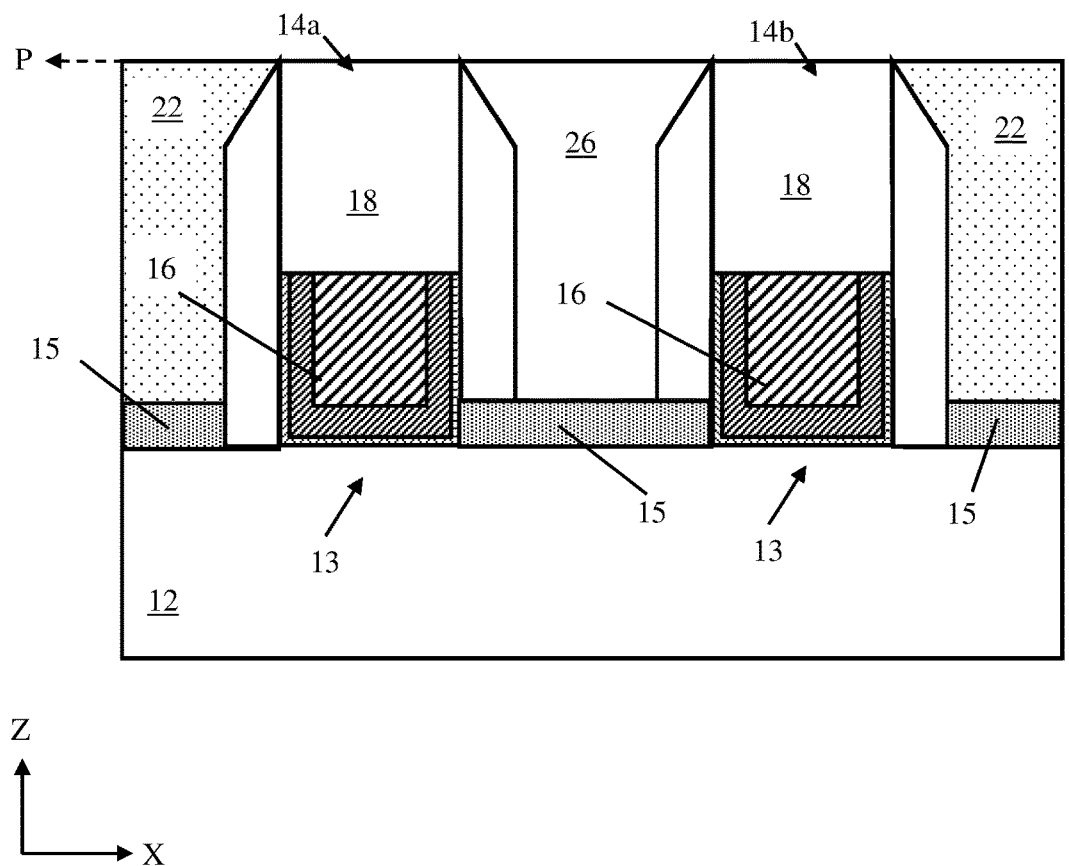
FIG. 5 shows a cross-sectional view of an opening being filled with an insulator according to embodiments of the disclosure.
Figure 6:
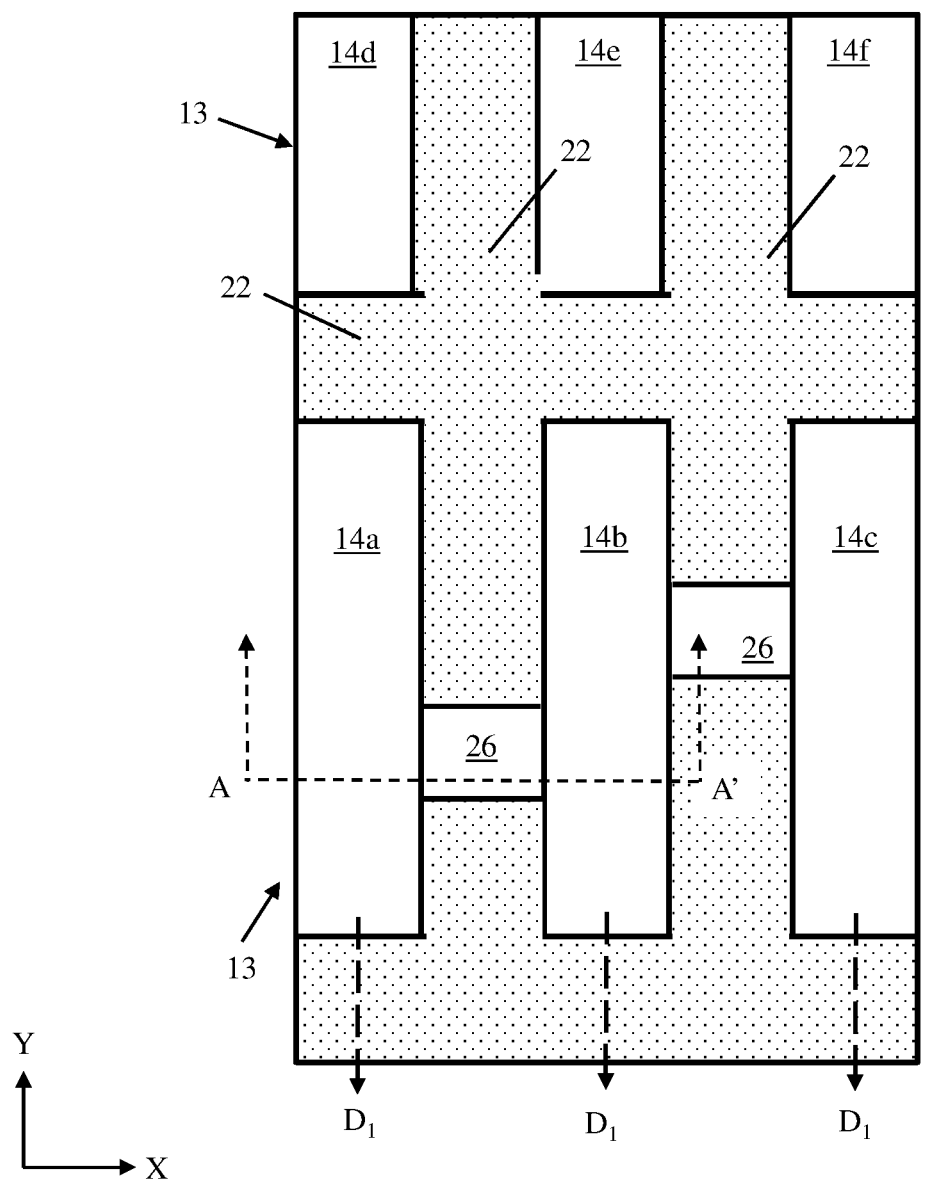
FIG. 6 shows a plan view of a structure with an insulator filled in an opening according to embodiments of the disclosure.

Turning to FIGS. 5 and 6 together, further processes according to the disclosure can include filling opening 24 with an insulator 26. Insulator 26 can be formed, e.g., by depositing or otherwise forming an electrically insulative material, e.g., one or more of the example insulating materials discussed elsewhere herein relative to gate spacers 18, within opening 24. FIG. 5 depicts a cross-section in the X-Y plane as viewed from line A-A', while FIG. 6 depicts a plan view in the X-Z plane. "Depositing" may include any now known or later developed techniques appropriate for causing a material to be deposited on a surface, including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, an/or evaporation. After being formed, portions of insulator 26 may extend above the upper surface of gate(s) 14a, 14b and/or semiconductor material 22. A user can planarize semiconductor material 22 and insulator, e.g., such that the upper surface of insulator 26 is substantially coplanar with the upper surface of gate(s) 14a, 14b, 14c, 14d, 14e, 14f, and semiconductor material 22, e.g., along line P (FIG. 5 only). Planarizing semiconductor material 22 and insulator 26 can also substantially confine insulator 26 to opening 24 (FIGS. 4-5). An example process for planarizing insulator 26 can include, e.g., chemical mechanical polishing (CMP). CMP refers to a method of removing layers of solid by chemical-mechanical polishing carried out for the purpose of surface planarization and definition of, e.g., metal interconnect patterns and/or other connecting elements.

Figure 7:
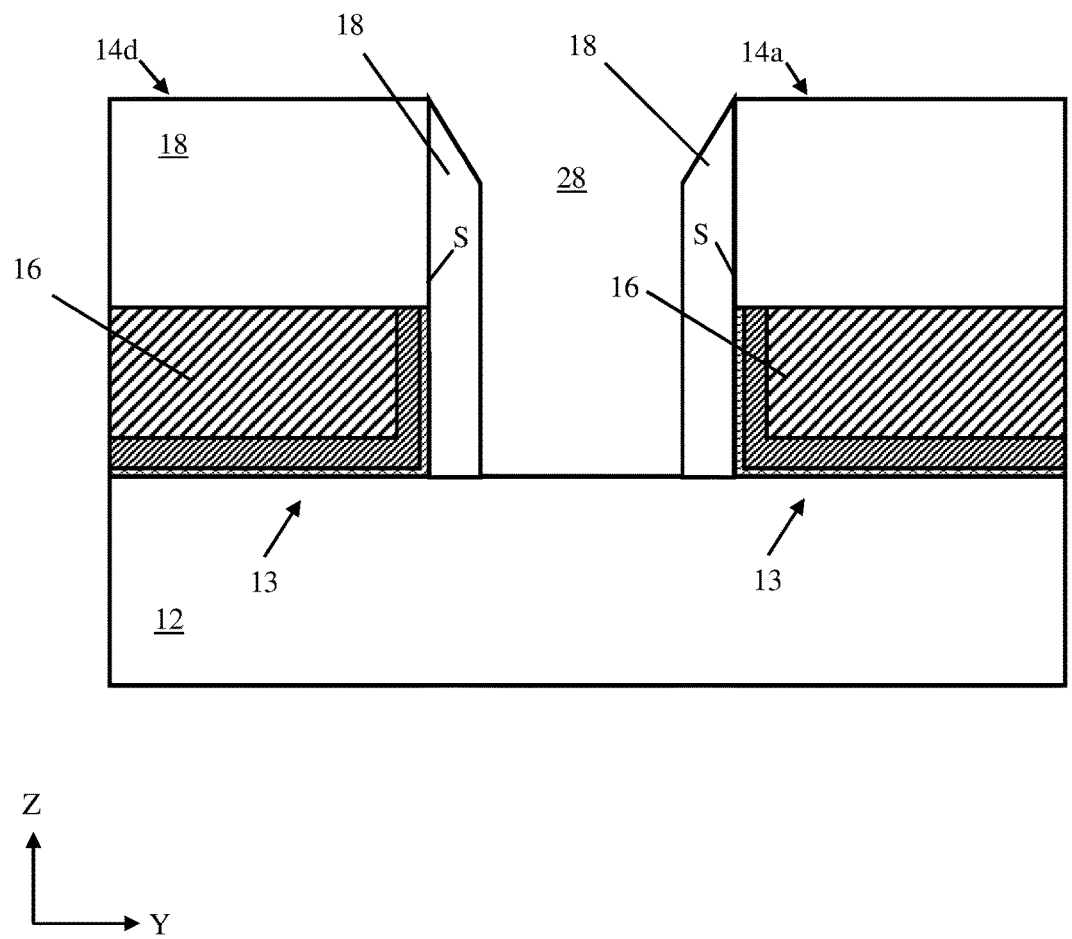
FIG. 7 shows a cross-sectional view of a rail trench being formed according to embodiments of the disclosure.
Figure 8:
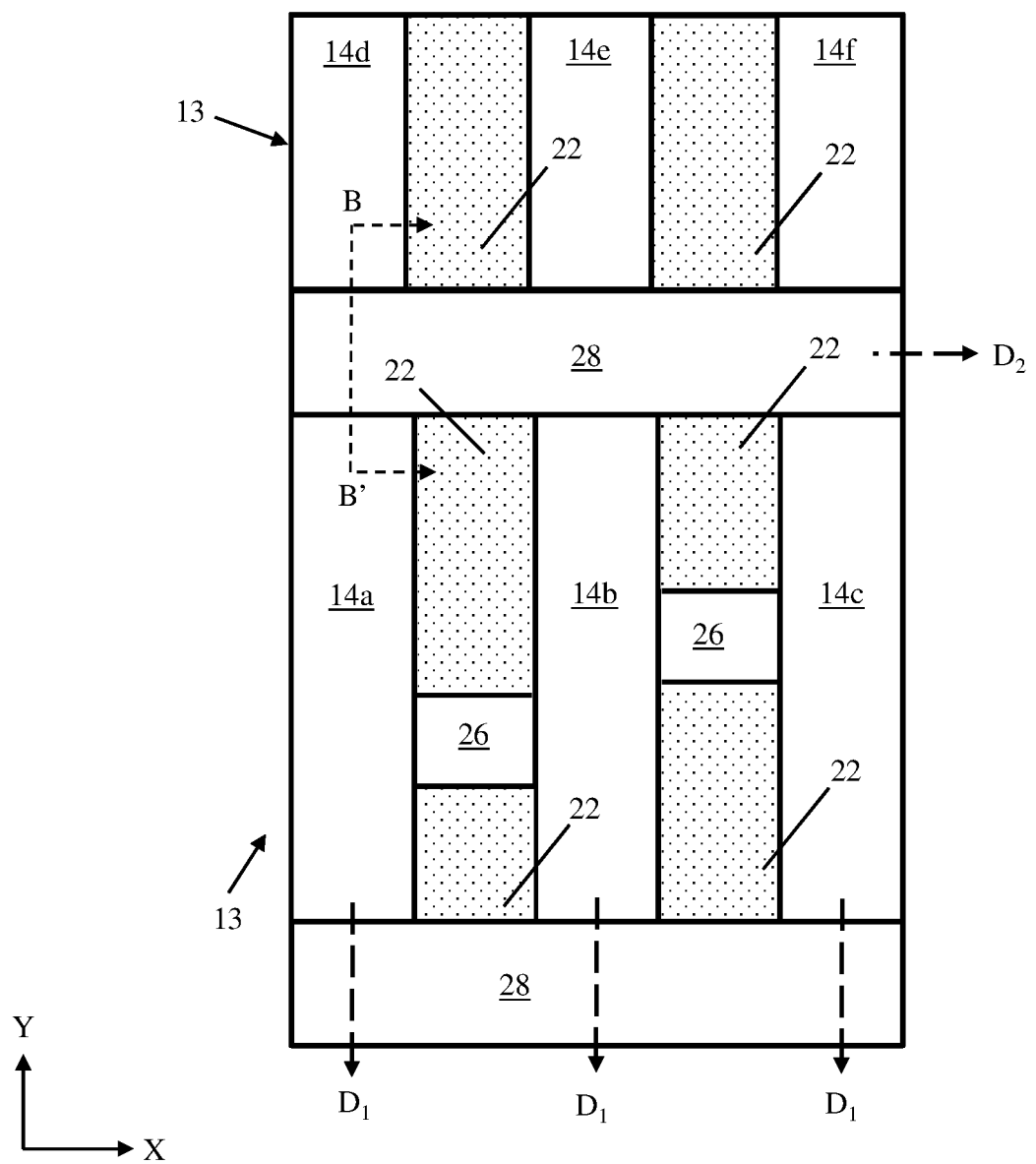
FIG. 8 shows a plan view of a structure with a rail trench according to embodiments of the disclosure.

Referring to FIGS. 7 and 8 together, embodiments of the disclosure include removing another portion of semiconductor material 22 to form a rail trench 28 positioned laterally between one set of gates 14a (FIG. 7 only), 14b, 14c and another set of gates 14d (FIG. 8 only), 14e, 14f. As shown, rail trench 28 can laterally abut an opposing end of one gate (e.g., 14a, 14d) and may be positioned directly between two sets of gates (e.g., gates 14a, 14b, 14c and gates 14d, 14e, 14f). The lateral thickness of rail trench 28 between two gates (e.g., gates 14a, 14d) can be between, e.g., approximately eight nanometers (nm) and approximately ten nm. Such dimensions may allow IC structures according to the disclosure to comply with design rules and/or other dimensional constraints for conductive rails, wires, etc., positioned between adjacent memory cells. A remaining portion of semiconductor material 22 (FIG. 8 only) can remain positioned between rail trench 28 and insulator 26. Rail trench 28 may define the position of a power rail of a conductive region formed in further processes described herein. Furthermore, conductive materials formed in rail trench 28 in further processes can define a power rail component in an IC structure. Rail trench 28 can be formed by any currently-known or later developed process of forming a trench-shaped opening in an IC structure, e.g., forming a mask on gates 14a, 14b, 14c, 14d, 14e, 14f and at least part of semiconductor material 22 while leaving a remaining portion of semiconductor material 22 exposed. Remaining portions of semiconductor material 22 can then be removed (e.g., by selective or non-selective etching as discussed herein) to yield rail trench 28. FIG. 7 depicts a cross-sectional view from line B-B' in FIG. 8, in the Y-Z plane, to further illustrate gate spacer 18. As shown in FIG. 7, gate spacer 18 can remain intact along lateral sidewalls S of gates 14a, and optionally on an upper surface of buried insulator 12, e.g., as a result of selective etchants being used to form rail trench 28 and/or terminating the etching process after gate spacer 18 becomes exposed. Rail trench 28 can extend in a second directional orientation $D_2$ (also referred to as a "second direction" herein) substantially in parallel with the X-axis. Second direction $D_2$ can extend substantially perpendicularly relative to first direction $D_1$, along which gates 14a, 14b, 14c and remaining portions of semiconductor material 22 are aligned. Thus, a remaining portion of semiconductor material 22 can be positioned between rail trench 28 and insulator 26 after rail trench 28 is formed.

Figure 9:
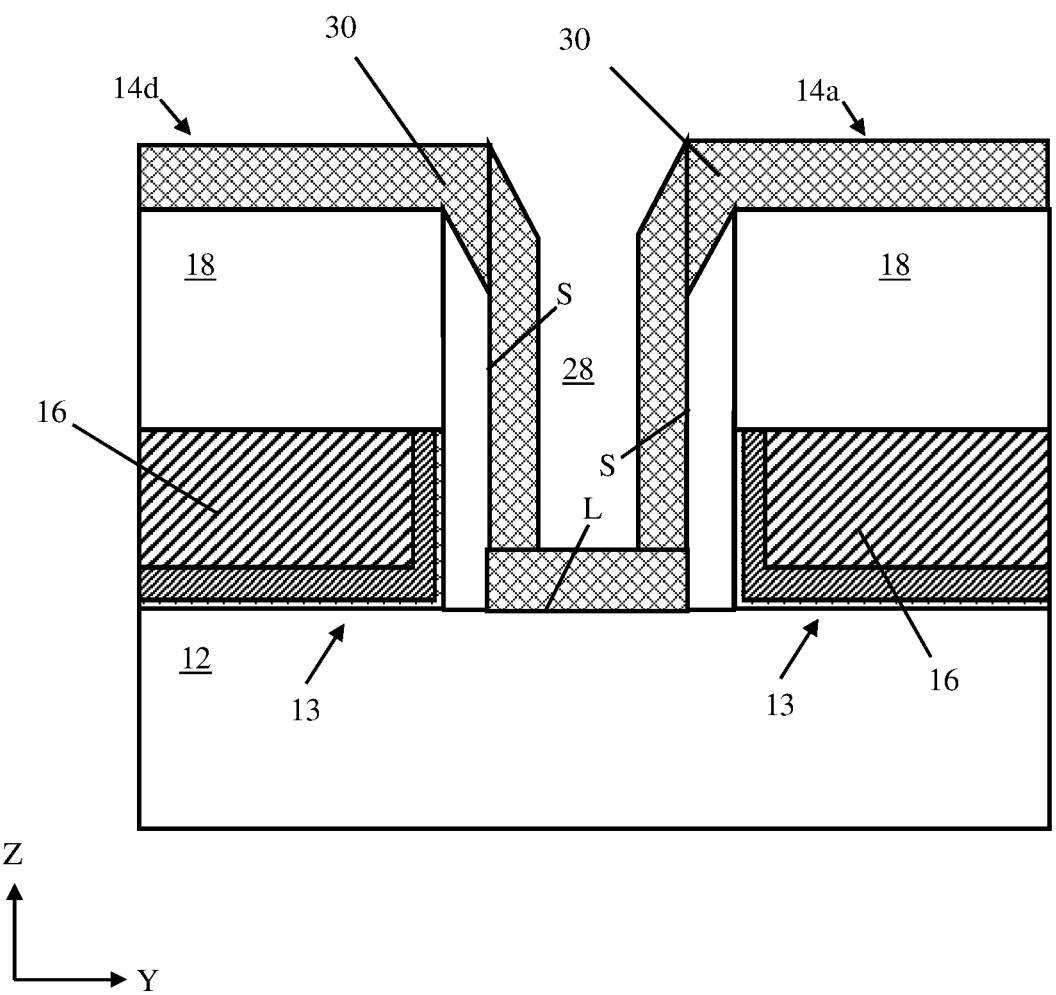
FIG. 9 shows a cross-sectional view of spacer material being formed in the rail trench according to embodiments of the disclosure.

Turning to FIG. 9, embodiments of the disclosure include forming a spacer material 30 over at least gate spacers 18 of gates 14a and semiconductor material 22 (FIG. 8). Spacer material 30 may have the same material composition as gate spacers 18 and/or may include one or more other currently-known or later insulating materials. However, spacer material 30 is shown with different cross-hatching from gate spacers 18 to emphasize differences between their relative positions. Spacer material 30 may be formed, e.g., by depositing a bulk insulating material on gate spacers 18 of gates 14a and/or other exposed surfaces (e.g., semiconductor material 22). Upon being formed, spacer material 30 can line a lower surface L and sidewalls S of rail trench 28 in addition to being positioned at least partially on an upper surface of gate spacers 18.

Figure 10:
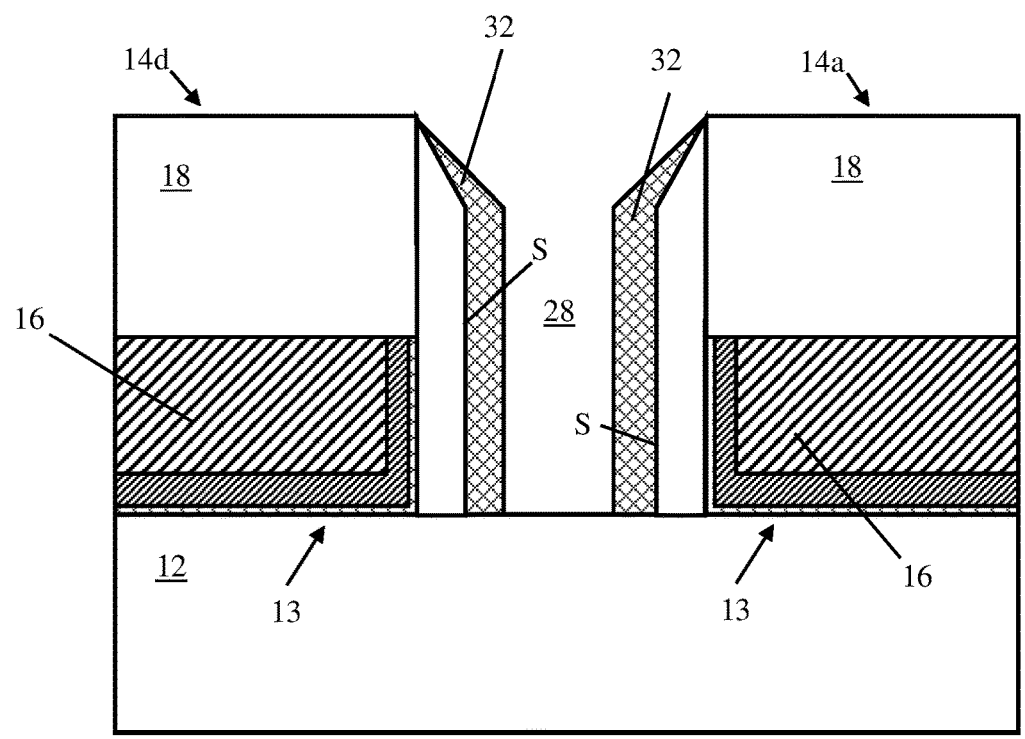
FIG. 10 shows a cross-sectional view of spacer material being processed according to embodiments of the disclosure.
Figure 11:
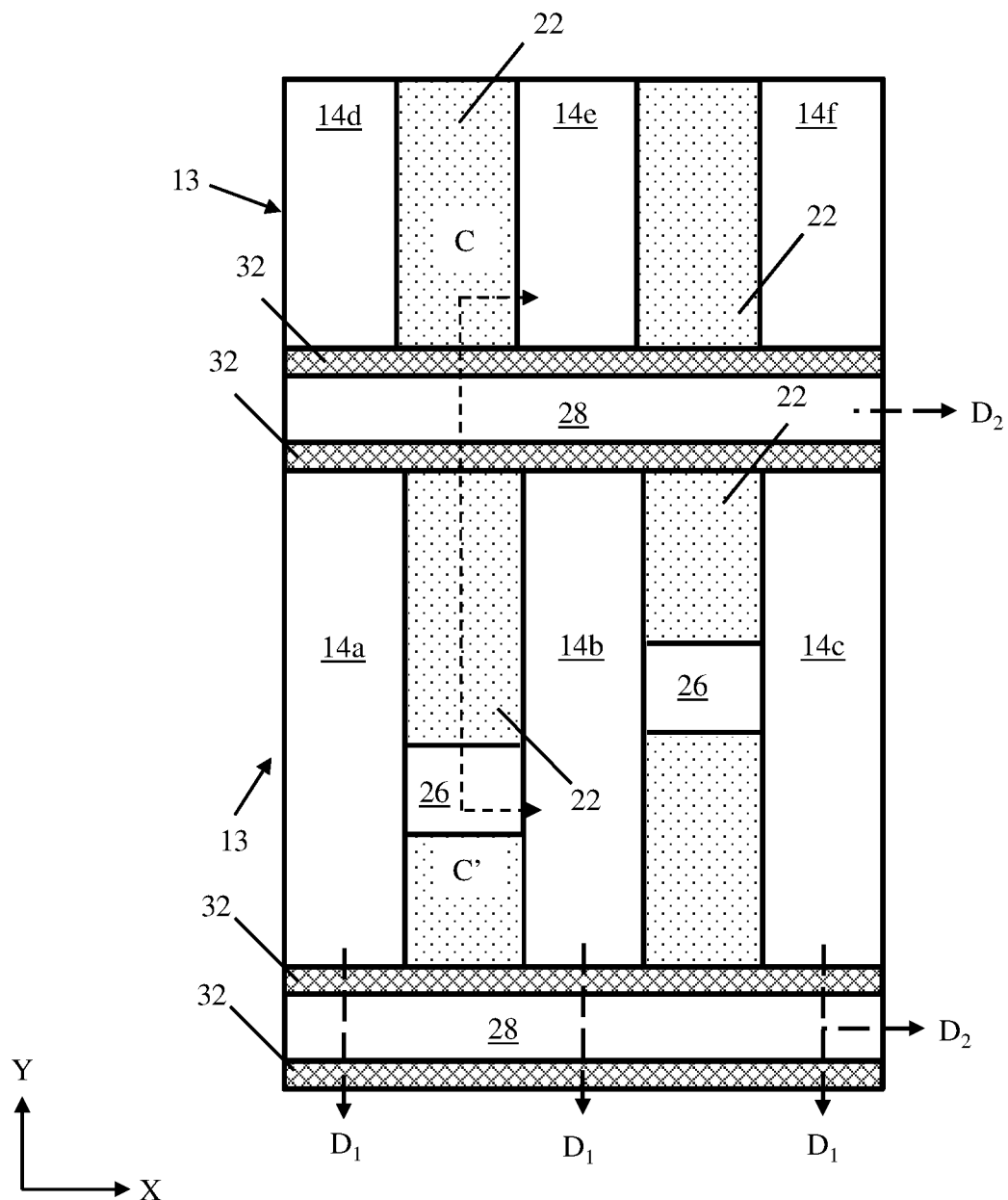
FIG. 11 shows a plan view of a structure with a rail trench and spacers therein according to embodiments of the disclosure.

Turning to FIGS. 10 and 11, spacer material 30 (FIG. 9) can be further processed to form a pair of spacers 32 on opposing lateral sidewalls S of rail trench 28. Spacer material 30 can be processed, e.g., by selectively or non-selectively etching portions of spacer material 30 to remove spacer material 30 from upper surfaces of gates 14a and semiconductor material 22 (FIG. 8). Removing portions of spacer material 30 can also expose portions of buried insulator layer 12 positioned at the bottom of rail trench 28. By removing spacer material 30 over a predetermined time and/or using a predetermined amount of etching material, remaining portions of spacer material 30 can define two spacers 32 lining interior sidewalls S of rail trench 28. As shown in the plan view of FIG. 11, spacers 32 can extend along second direction $D_2$, in parallel with rail trench 28. Thus, spacers 32 can be positioned directly laterally between rail trench 28 and each gate 14a, 14b, 14c, 14d, 14e, 14f, and can abut remaining portions of semiconductor material 22.

Figure 12:
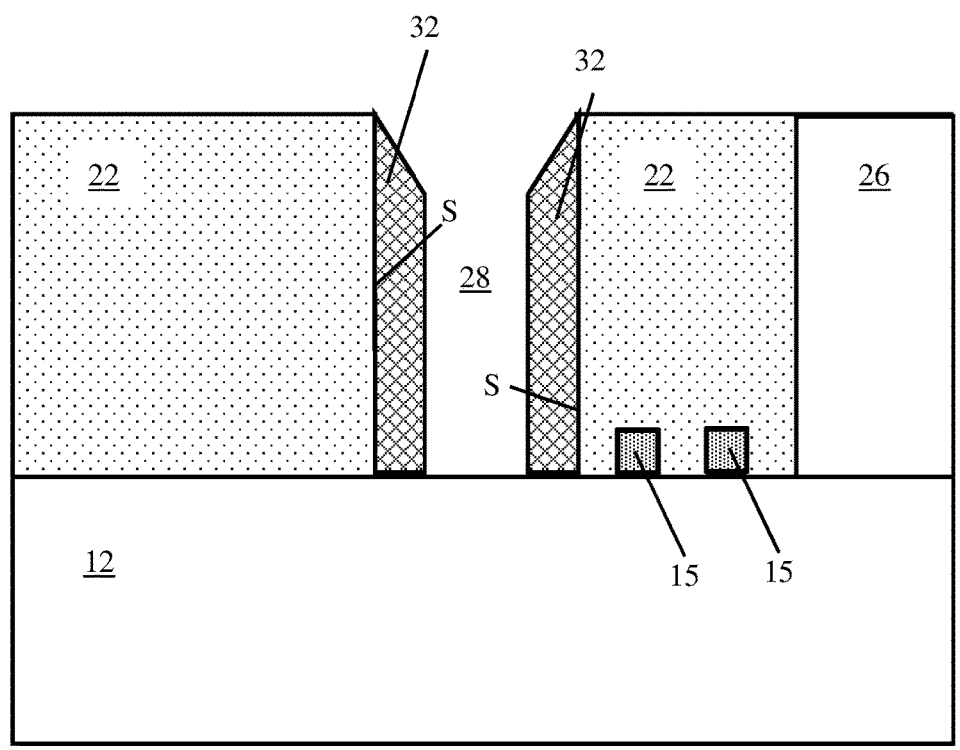
FIG. 12 shows a cross-sectional view of a rail trench with spacers according to embodiments of the disclosure.

Referring to FIG. 12, a cross-sectional view in the Y-Z plane from line C-C' in FIG. 11 is shown to further illustrate semiconductor material 22, rail trench 28, and spacers 32. Embodiments of the disclosure include further processing semiconductor material 22 to define locations where one or more substantially T-shaped wires may be formed, as described herein. As shown, rail trench 28 is positioned over a portion of buried insulator layer 12. Semiconductor material 22 can extend substantially perpendicularly relative to the orientation of rail trench 28. Spacers 32, formed in other processes discussed herein, can be formed on portions of semiconductor material 22 which define interior sidewalls S of rail trench 28.

Figure 13:
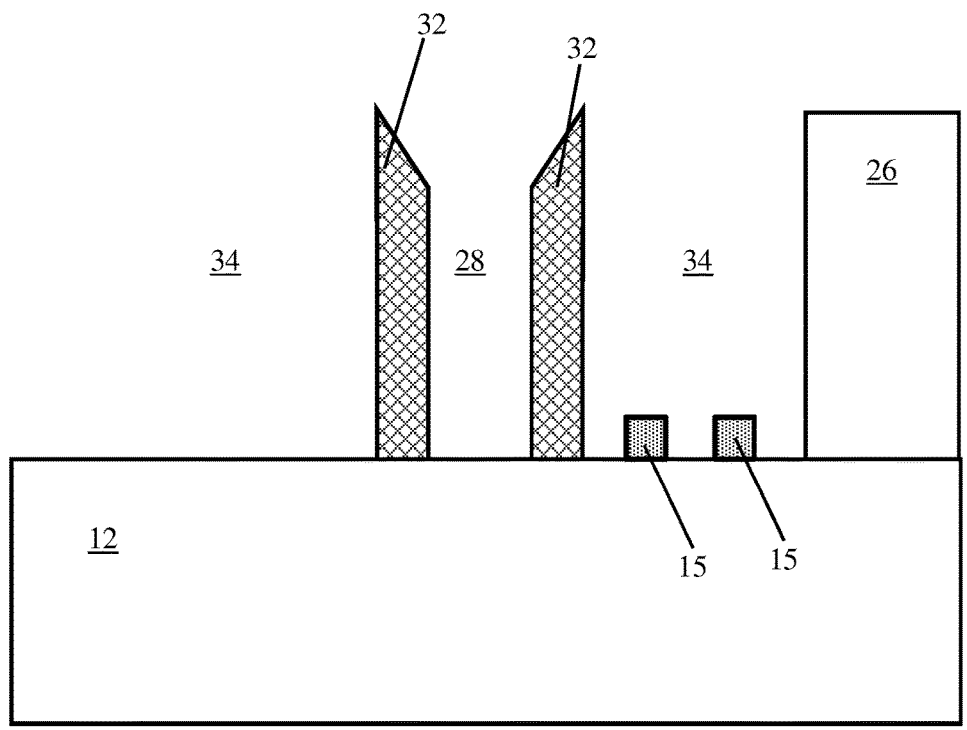
FIG. 13 shows a cross-sectional view of a wire trench being formed adjacent to the rail trench according to embodiments of the disclosure.
Figure 14:
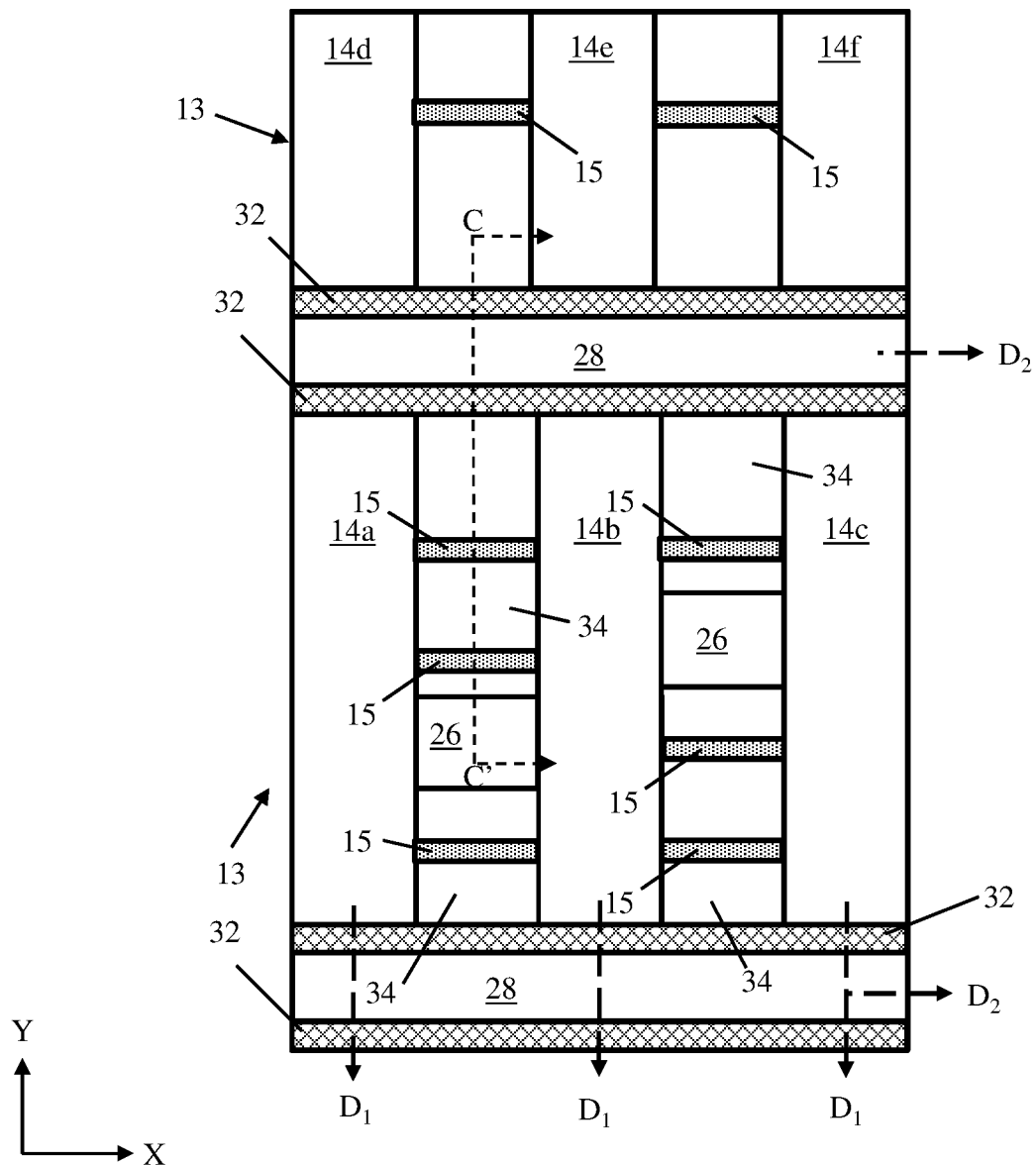
FIG. 14 shows a plan view of a structure with rail trenches and wire trenches according to embodiments of the disclosure.

Referring to FIGS. 13 and 14 together, embodiments of the disclosure can include removing a remaining portion of semiconductor material 22 (FIG. 12) positioned between spacer(s) 32 and insulator 26 to form one or more wire trenches 34. To form wire trench(es) 24, remaining portions of semiconductor material 22 can be removed, e.g., by one or more selective or non-selective removal processes (e.g., etching) discussed elsewhere herein relative to other processes for removing portions of semiconductor material 22. Each wire trench 34 can extend substantially perpendicularly relative to rail trench 28, and as shown in FIG. 14, may be positioned directly laterally between two gates (e.g., gates 14a, 14b) which are oriented in parallel with respect to each other. After wire trench(es) 34 have been formed, a portion of spacer(s) 32 may continue to separate rail trench 28 from wire trench(es) 34.

Figure 15:
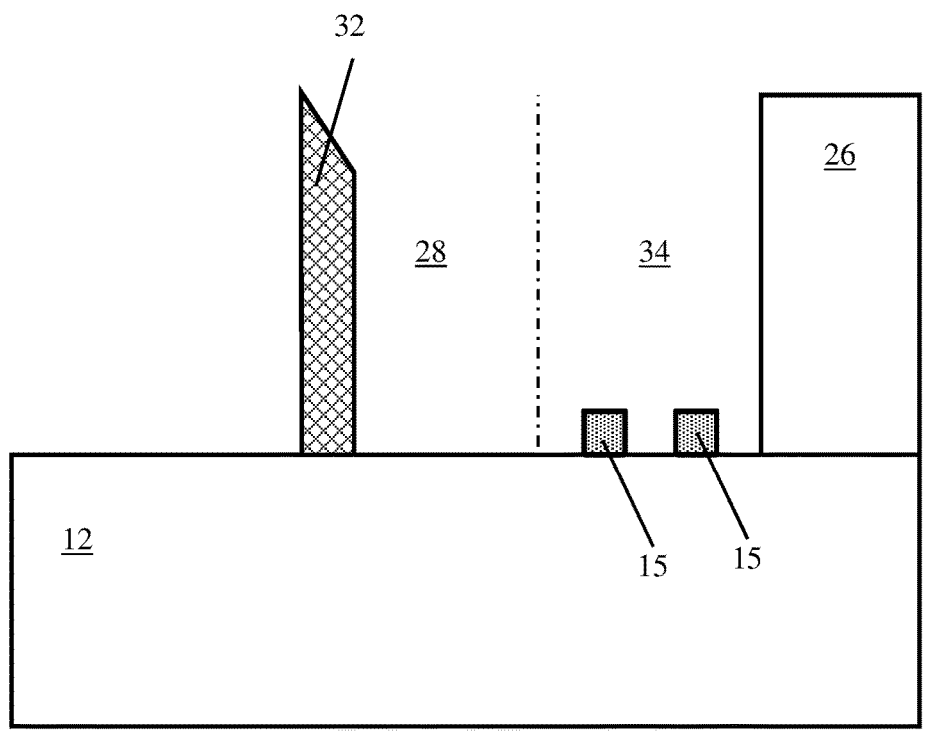
FIG. 15 shows a spacer being removed to connect a wire trench to a rail trench according to embodiments of the disclosure.
Figure 16:
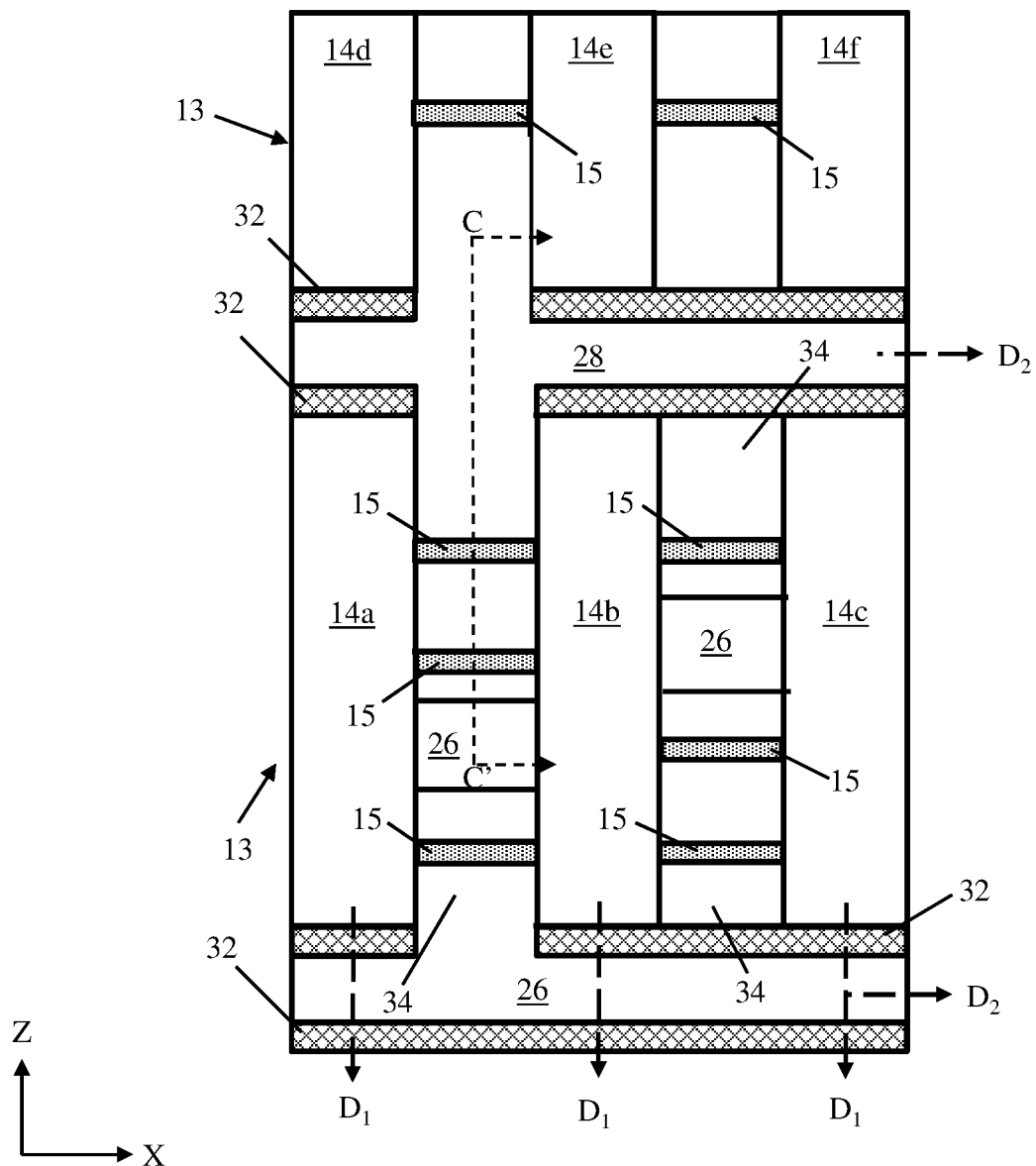
FIG. 16 shows a plan view of a structure with connected wire trenches to rail trenches according to embodiments of the disclosure.

Turning to FIGS. 15 and 16, methods according to the disclosure can include removing a portion of spacer(s) 32 to connect rail trench 28 to wire trench(es) 34. One or more portions of spacer(s) 32 can be removed, e.g., by the use of targeted etching and/or one or more other processes of removing a material from an IC structure discussed by example herein. According to an example embodiment, portions of spacer(s) 32 separating rail trench 28 from wire trench(es) 34 can be targeted for removal by positioning a lithographic mask (not shown) over rail trench 34, and applying a selective etchant within wire trench(es) 34, thereby removing portions of exposed portions of spacer(s) 32 within wire trench(es) 34. Regardless of the methodology for removing portions of spacer(s) 32, a single spacer 32 may continue to coat a lower surface of rail trench 28 and wire trench(es) 34 after portions of spacer(s) 32 are removed, as depicted in FIG. 15. Referring specifically to FIG. 16, the junction between rail trench 28 and wire trench 34 can form a junction laterally adjacent to two or more gates (e.g., gates 14a, 14b), which may be substantially cross-shaped, substantially T-shaped, etc.

Figure 17:
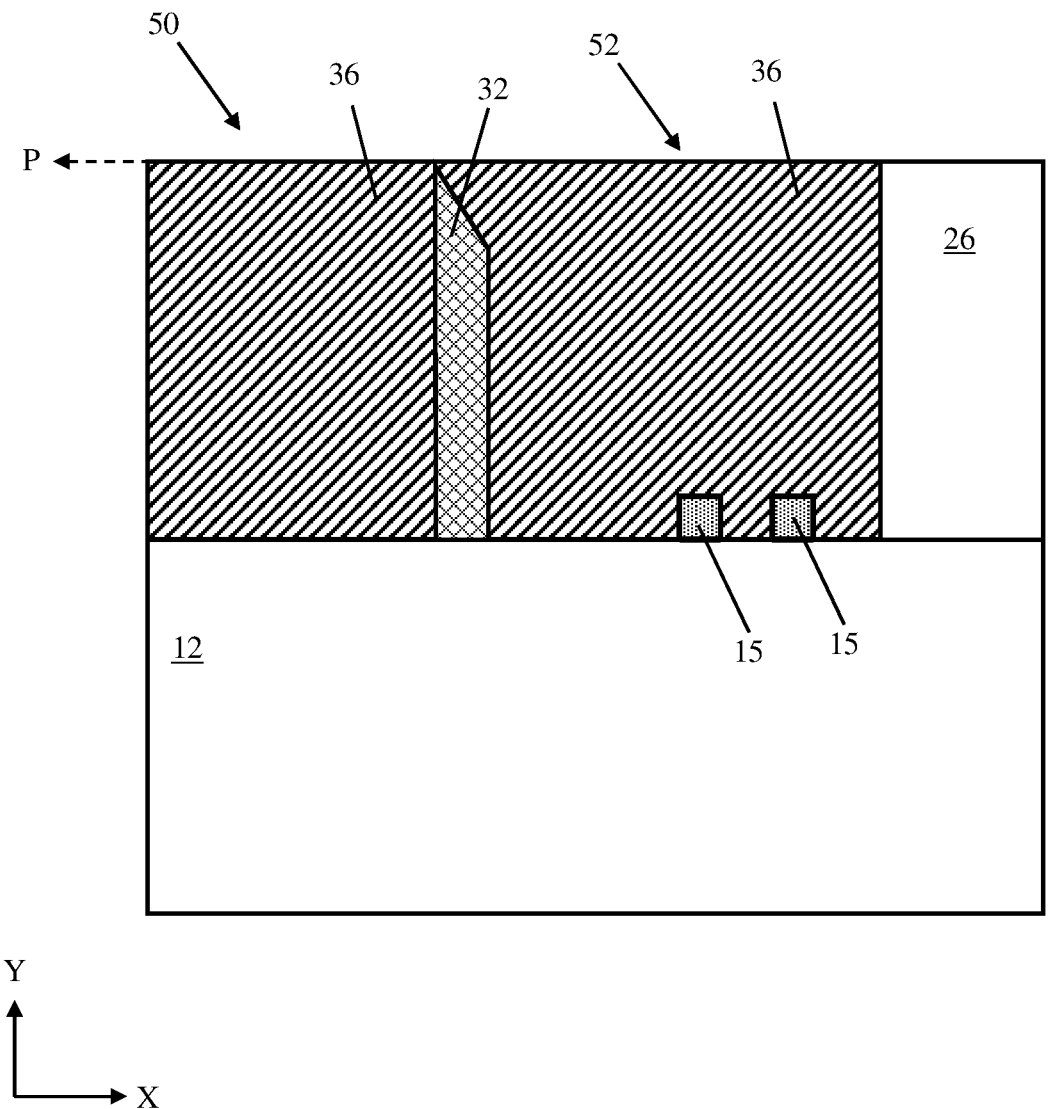
FIG. 17 shows a cross-sectional view of a wire formed in the wire trench according to embodiments of the disclosure.
Figure 18:
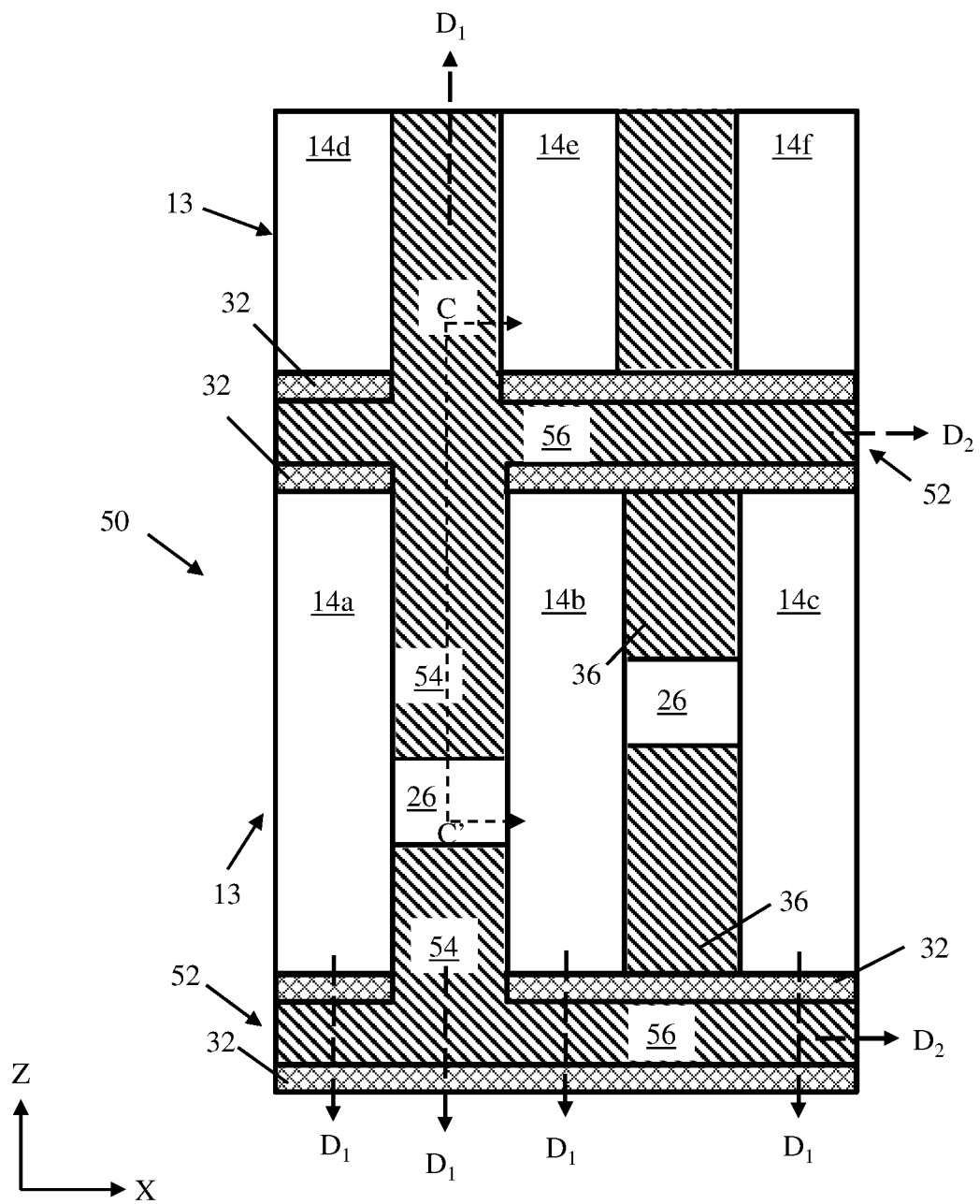
FIG. 18 shows a plan view of an IC structure according to embodiments of the disclosure.

Referring to FIGS. 17 and 18 together, methods according to the disclosure can include filling rail trench 28 and wire trench 34 (FIGS. 15-16) with a conductor 36 to yield an IC structure 50. Conductor 36 can include one or more conductive metals, metal alloys, etc., operable for use as an electrically conductive element in an IC structure. According to an example, conductor 36 can include a refractory metal, e.g., tungsten (W), tantalum (Ta), chromium (Cr), etc. Conductor 36 may include other metals, alloys, metallic substances, etc., in further embodiments. For example, conductor 36 may alternatively include copper (Cu), aluminum (Al), cobalt (Co), etc. Upon being formed, conductor 36 may contact and overlie portions of gate spacer 18 which remain over buried insulator layer 12. Processes according to the disclosure can also include planarizing portions of conductor 36 and/or other materials contacting and overlying gates 14a, 14b, 14c, 14d, 14e, 14f, such that the upper surface of conductor 36 is substantially coplanar with the upper surface of adjacent elements, e.g., along line P (FIG. 17 only). A liner, e.g., of refractory metals, materials made from refractory metals, and/or an additional oxide/nitride dielectric layer can also be formed between conductor 36 and adjacent components. Such liners can include titanium nitride (TiN), tantalum nitride (TaN), tantalum (Ta), and titanium (Ti). Though liners can be formed together with conductor 36 to reduce or prevent electromigration degradation, such liners are omitted from the accompanying FIGS. for the sake of clarity.

As shown in FIG. 18, forming conductor 36 in rail trench 38 and wire trench 34 can define a conductive region 52 of IC structure 50. As discussed herein, conductive region 52 may be embodied as a unitary structure, including tapping wire 54 extending along first direction $D_1$ and power rail 56 extending along second direction $D_2$, substantially perpendicular to first direction $D_1$. In an embodiment, tapping wire 54 may form the stem of a substantially T-shaped conductive region 52, with power rail 56 extending substantially perpendicularly to tapping wire 54 at a lateral end of tapping wire 54.

Embodiments of the present disclosure provide integrated circuit structure 50 which may be structured, e.g., as shown by example in FIGS. 17-18. IC structure 50 can include, e.g., at least one conductive region 52 including a tapping wire 54 (FIG. 18 only) extending in first direction $D_1$ (e.g., in parallel with gates 14a, 14b, 14c), and a power rail 56 (FIG. 18 only) extending in second direction $D_2$ (e.g., perpendicular to gates 14a, 14b, 14c and tapping wire 54). Insulator 26 can laterally abut an end of tapping wire 54 of conductive region 52, such that insulator 26 is positioned opposite power rail 56. Laterally adjacent gates 14a, 14b may thereby be included in IC structure 50 as a pair of gates 14a, 14b extending in the first direction and laterally abutting opposite sides of insulator 26 and tapping wire 54 of conductive region 52. As discussed elsewhere herein, gate spacer(s) 18 of two or more gates 14a, 14b, 14c, 14d, 14e, 14f can directly laterally abut conductive region 52. Buried insulator layer 12 and/or semiconductor fin 15 can underlie gates 14a, 14b, insulator 26, and conductive region 52. Power rail 56 of conductive region 52 can be positioned directly laterally between one of a predetermined pair of gates (e.g., gate 14a, 14b) and another gate (e.g., another gate 14a, 14b) of IC structure 10. An upper surface of gates 14a, 14b can also be substantially coplanar with an upper surface of conductive region 52 and insulator 26.

As illustrated in FIG. 18, structure 50 can include multiple conductive regions 52 laterally abutting insulator 26, each of which may include respective tapping wires 54 and power rails 56 as discussed herein. According to the arrangement depicted by example in FIG. 18, each pair of gates 14a, 14b can be directly laterally adjacent to multiple conductive regions 52. In embodiments where conductive region(s) 52 are formed in a single process of filling rail trench 28 and wire trench 34, tapping wire 54 may be structurally continuous with power rail 56. As discussed elsewhere herein, each conductive region 52 can include one or more metals (e.g., a refractory metal and/or compound, alloy, etc., thereof). Insulator 26 can laterally separate each conductive region 52 from other distinct conductive regions 52.

Embodiments of IC structure 50 can include conductive regions 52 which provide multiple functions during operation. Power rail 56 of conductive region(s) 52 can transmit electric current from a power source (not shown) for electrically driving a group of memory cells, each of which may include gate(s) 14a, 14b, 14c, 14d, 14e, 14f and semiconductor fins of respective transistors. To communicate electrical current from power rail 56 to predetermined cells and/or transistors, tapping wire 54 can extend substantially perpendicularly relative to power rail 56 to serve as an electrical tap to semiconductor fin(s) 15 and/or other contacts for driving each transistor. Conductive region(s) 52 can thus unify the functions of a power rail and tapping wire in IC structure 50, and can be manufactured in compliance with spacing requirements for distinct sets of gates (e.g., gates 14a, 14b, 14c and gates 14d, 14e, 14f) in IC structure 50.

The method as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) structure, comprising:
   a first conductive region including a first tapping wire extending in a first direction, and a first power rail extending in a second direction substantially perpendicular to the first direction;
   an insulator directly laterally abutting the first conductive region at a first end of the first tapping wire on a same level of the IC structure, wherein the first power rail directly laterally abuts a second, opposite end of the first tapping wire on the same level of the IC structure, wherein the insulator is positioned laterally between the first tapping wire and a second tapping wire, and positioned on at least one semiconductor fin;
   a pair of gates each extending in the first direction and laterally abutting opposing sidewalls of the insulator and the first tapping wire of the first conductive region;
   a second conductive region extending in the first direction and positioned on the at least one semiconductor fin and having a first sidewall laterally abutting one of the pair of gates;
   an additional gate extending in the first direction and laterally abutting a second sidewall of the second conductive region opposite the first sidewall; and
   a gate spacer extending continuously in the second direction from an end of one of the pair of gates to an end of the additional gate, wherein the gate spacer is positioned directly laterally between the first power rail of the first conductive region and each of: one of the pair of gates, the second conductive region, and the additional gate.

2. The IC structure of claim 1, wherein the first power rail and the first tapping wire of the first conductive region define a T-shape.

3. The IC structure of claim 1, further comprising a buried insulator layer underlying each of the pair of gates, the insulator, the first conductive region, the second conductive region, the additional gate, and the gate spacer, wherein the first power rail is located on the same level of the IC structure as the pair of gates.

4. The IC structure of claim 1, wherein the first conductive region comprises tungsten (W).

5. The IC structure of claim 1, wherein the first tapping wire of the first conductive region is structurally continuous with the first power rail of the first conductive region.

6. The IC structure of claim 1, wherein a lateral thickness of the first power rail in the first direction is between approximately eight nanometers (nm) and approximately ten nm.

7. The IC structure of claim 1, wherein the first power rail of the first conductive region is positioned laterally between one of the pair of gates, and an adjacent gate on the same level of the IC structure.

8. An integrated circuit (IC) structure, comprising:
   a set of gates positioned over a buried insulator layer and each extending in a longitudinal direction, wherein the set of gates includes a first longitudinal trench between a first gate and a second gate of the set of gates, and a second longitudinal trench between the second gate and a third gate of the set of gates;

a first conductive region including:
   a first power rail having a latitudinal orientation and positioned at a first longitudinal end of each of the set of gates, and
   a first tapping wire structurally continuous with the first power rail and positioned within the first longitudinal trench, directly between the first gate and the second gate of the set of gates;
an insulator positioned on a semiconductor fin and directly laterally abutting the first conductive region within the first longitudinal trench at a first end of the first tapping wire on a same level of the IC structure, wherein the first power rail directly laterally abuts a second, opposite end of the first tapping wire on the same level of the IC structure, and wherein the first power rail is located on the same level of the IC structure as the set of gates;
a second conductive region positioned on the semiconductor fin and within the second longitudinal trench between the second gate and the third gate of the set of gates; and
a gate spacer positioned at a longitudinal end of the second gate and the third gate, having the latitudinal orientation, and extending continuously alongside the longitudinal end of the second gate and the third gate, and a longitudinal end of the second conductive region, wherein the gate spacer is positioned directly laterally between the first power rail of the first conductive region and each of: the second gate, the second conductive region, and the third gate.

9. The IC structure of claim 8, wherein the first conductive region defines a T-shape.

10. The IC structure of claim 8, wherein the first conductive region includes tungsten (W).

11. The IC structure of claim 10, wherein the second conductive region comprises one of copper (Cu), aluminum (Al), or cobalt (Co).

12. The IC structure of claim 8, wherein the first power rail of the first conductive region is positioned laterally between one of the pair of gates, and a longitudinally adjacent gate on the same level of the IC structure.

13. An integrated circuit (IC) structure, comprising:
a set of gates positioned over a buried insulator layer and each extending in a longitudinal direction, wherein the set of gates includes a first longitudinal trench between a first gate and a second gate of the set of gates, and a second longitudinal trench between the second gate and a third gate of the set of gates;
a first conductive region including:
   a first power rail having a latitudinal orientation and positioned at a first longitudinal end of each of the set of gates, and
   a first tapping wire structurally continuous with the first power rail and positioned within the first longitudinal trench, directly between the first gate and the second gate of the set of gates;
an insulator positioned on a semiconductor fin and directly laterally abutting the first conductive region within the first longitudinal trench at a first end of the first tapping wire on a same level of the IC structure, wherein the first power rail directly laterally abuts a second, opposite end of the first tapping wire on the same level of the IC structure, and wherein the first power rail is located on the same level of the IC structure as the set of gates;
a second conductive region including:
   a second power rail having a latitudinal orientation and positioned at a second longitudinal end of each of the set of gates opposite the first longitudinal end, and
   a second tapping wire structurally continuous with the second power rail and positioned within the first longitudinal trench, directly between the first gate and the second gate of the set of gates, wherein the insulator is positioned laterally between the first and second tapping wires;
a third conductive region positioned on the semiconductor fin and within the second longitudinal trench between the second gate and the third gate of the set of gates; and
a gate spacer positioned at a longitudinal end of the second gate and the third gate, having the latitudinal orientation, and extending continuously alongside the longitudinal end of the second gate and the third gate, and a longitudinal end of the third conductive region, wherein the gate spacer is positioned directly laterally between the first conductive region and each of: the second gate, the third conductive region, and the third gate.

14. The IC structure of claim 13, wherein each of the first conductive region, the second conductive region, and the third conductive region have a same height above the buried insulator layer.

15. The IC structure of claim 13, wherein the first conductive region, the second conductive region, and the set of gates are each positioned within a same layer of the IC structure.

16. The IC structure of claim 13, wherein the second conductive region further includes a third tapping wire structurally continuous with the second power rail and positioned laterally opposite the second tapping wire, wherein the third tapping wire is positioned between a longitudinally adjacent pair of gates.

17. The IC structure of claim 13, wherein a material composition of the third conductive region is different from a material composition of the first and second conductive regions.

* * * * *